United States Patent [19]

Zarabadi et al.

[11] Patent Number: 4,996,499

[45] Date of Patent: Feb. 26, 1991

[54] AMPLITUDE STABILIZED OSCILLATOR AMPLIFIER

[75] Inventors: Seyed R. Zarabadi, Columbus, Ohio; Linh N. Pham, Kokomo, Ind.

[73] Assignee: Delco Electronics Corporation, Kokomo, Ind.

[21] Appl. No.: 407,842

[22] Filed: Sep. 15, 1989

[51] Int. Cl.⁵ .......................... H03F 3/26; H03F 3/16
[52] U.S. Cl. .................................. 330/264; 330/277; 331/114
[58] Field of Search ................... 330/84, 85, 263, 264, 330/265, 266, 269, 271, 272, 277, 289, 293; 331/108 A, 108 C, 114

[56] References Cited

U.S. PATENT DOCUMENTS 4,243,946 1/1981 Wang ............................ 330/266 X

FOREIGN PATENT DOCUMENTS 0788342 12/1980 U.S.S.R. .................... 330/265

OTHER PUBLICATIONS

IBM Tech. Disc. Bull., vol. 32, No. 2, pp. 84–85, Jul. 1989.

Primary Examiner—Steven Mottola
Attorney, Agent, or Firm—Albert F. Duke

[57] ABSTRACT

An inverting amplifier useful in an oscillator circuit includes complementary serially connected first and second metal-oxide-semiconductor field effort transistor (MOSFETS) and first and second resistors, two capacitors, a first feedback circuit having two MOSFETS in series with a third resistor and a second feedback circuit having two MOSFETS and a fourth resistor in series. Each feedback circuit provides a feed back path from the drain of one of the output transistors to the gate thereof. The resistors are polysilicon type resistors and have a negative thermal coefficient. The amplifier has a very stable output signal amplitude which is essentially independent of integrated circuit manufacturing processing variations and operating temperature variations within useful ranges.

19 Claims, 2 Drawing Sheets

AMPLITUDE STABILIZED OSCILLATOR AMPLIFIER

FIELD OF THE INVENTION

This invention relates to amplifiers and in particular to inverting amplifiers employed in oscillator circuits.

BACKGROUND OF THE INVENTION

Oscillators which comprise tuned circuits and amplifiers that use ac and dc feedback can have gain variations and signal clipping because the electrical characteristics of the amplifiers vary with integrated circuit (IC) manufacturing process variations and with temperature variations. An example of a prior art oscillator circuit 10 is shown in FIG. 1. Oscillator circuit 10 comprises an inverting amplifier 12 and a tuned circuit 14 which is shown within the dashed line rectangle. In one illustrative embodiment tuned circuit 14 comprises capacitors 16 and 18 and a resonator (crystal) 20. An input of amplifier 12 is coupled to first terminals of resonator 20 and capacitors 16 and to a terminal 22. An output of amplifier 12 is coupled to second terminals of resonator 20 and capacitor 18 and to a terminal 24. Second terminals of capacitors 16 and 18 are coupled together to a terminal 26, which is shown coupled to a reference voltage that is illustratively ground (zero volts).

In FIG. 2 there is shown a prior art inverting amplifier 100 which comprises a p-channel metal-oxide-semiconductor (MOS) transistor 102, an n-channel MOS transistor 104 and a resistor 106. The structure of amplifier 100 is typically used as amplifier 12 of FIG. 1. The source of transistor 102 is coupled to a terminal 108 and to a positive voltage Vdd. The source of transistor 104 is coupled to a terminal 110 and to a reference voltage which is illustratively ground (zero volts). A first terminal of resistor 106 is coupled to the gates of transistors 102 and 104 and to a terminal 112 which serves as an input terminal of amplifier 100. The drains of transistors 102 and 104 are coupled to a second terminal of resistor 106 and to a terminal 114 which serves as an output terminal of amplifier 100. Resistor 106 provides an ac and a dc feedback from the output terminal 114 to the gates of transistors 102 and 104. Variations in the IC manufacturing process used to fabricate amplifier 100 and operating temperature changes affect the gain of amplifier 100. Accordingly, it is difficult to predict the peak-to-peak output voltage of amplifier 100.

It is desirable to have an integrated circuit (IC) inverting amplifier which generates an output signal having an amplitude which is essentially insensitive to variations in the IC manufacturing process and operating temperature variations. Such an amplifier is particularly useful as a component of an oscillator circuit.

SUMMARY OF THE INVENTION

The present invention is directed to a solid-state (Integrated Circuit {IC}) inverting amplifier which when used as part of an oscillator circuit provides an output signal whose amplitude stays essentially constant independent of variations in the IC manufacturing process and independent of operating temperature variations. The amplifier comprises first . and second complementary output transistors and first and second independent negative feedback circuit means coupled to the first and second transistors, respectively, for independently controlling the operating voltages of the output transistors.

In a preferred embodiment the amplifier is fabricated on a silicon substrate (body) and the output transistors are metal-oxide-semiconductor field effect transistors (MOSFETS) with each transistor having a separate resistor coupling same to a voltage supply terminal. Each feedback circuit comprises a resistor and two MOSFETS of the same conductivity type as the output transistor for which they provide feedback. The resistors are all polysilicon resistors and have a negative thermal coefficient.

The invention will be better understood from the following more detailed description taken with the accompanying drawings and claims.

DETAILED DESCRIPTION

Figure 1:
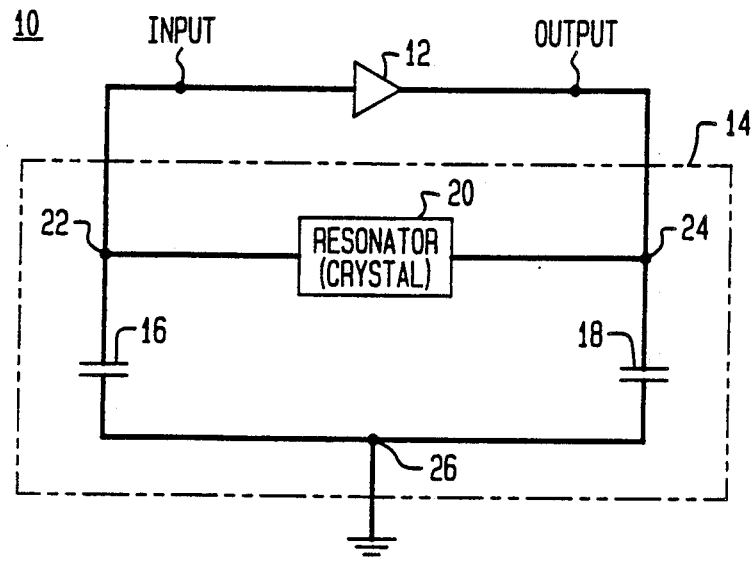
FIG. 1 is diagram of a prior art oscillator which is discussed hereinabove.
Figure 2:
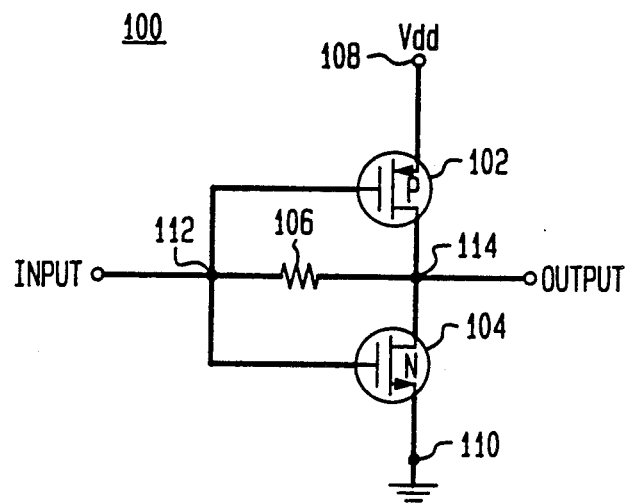
FIG. 2 is an electrical schematic diagram of a prior art inverting amplifier which can be used as the amplifier of the oscillator of FIG. 1 and which is discussed hereinabove.
Figure 3:
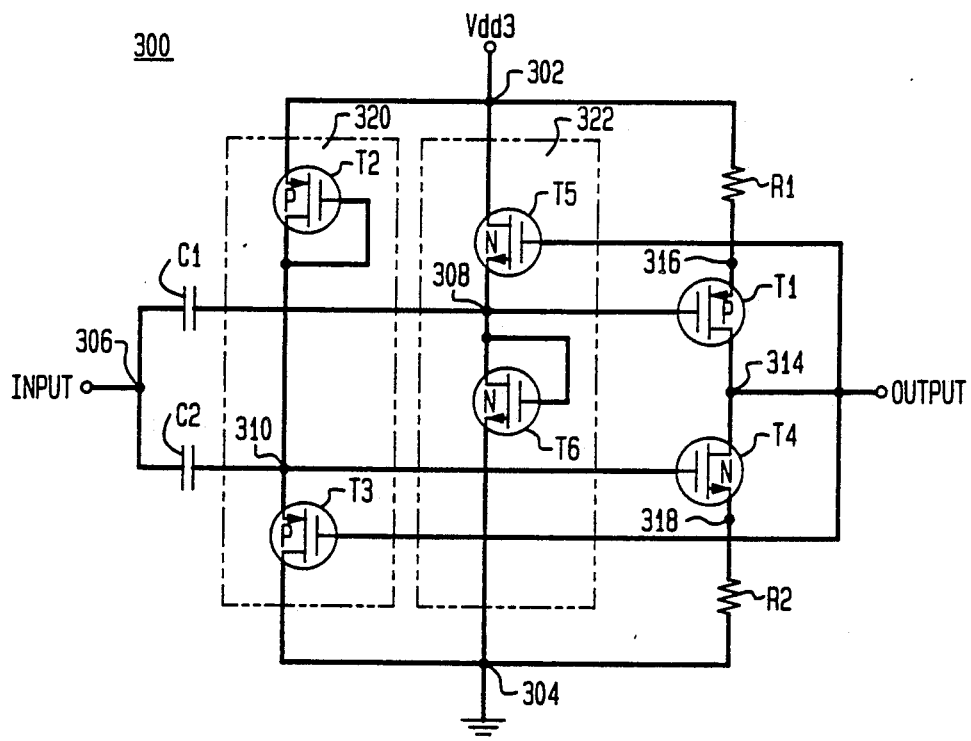
FIG. 3 is an electrical schematic diagram of an amplifier in accordance with the present invention.

Referring now to FIG. 3, there is shown an amplifier 300 in accordance with an embodiment of the invention. The structure of amplifier 300 is useful as amplifier 12 of FIG. 1. Amplifier 300 comprises p-channel field effect transistors (FETS) T1, T2 and T3, n-channel FETS T4, T5 and T6, resistors R1 and R2 and capacitors C1 and C2. Transistors T2 and T6 both have their gates coupled to their respective drains and as such are configured essentially as diodes. By appropriate sizing of transistors T1, T2, T3, T4, T5, and T6 and by appropriate selection of the temperature coefficients of resistors R1 and R2, the gain of amplifier 300 is essentially independent of IC manufacturing and operating temperature variations.

The source of T2, the drain of T5 and a first terminal of R1 are coupled to a terminal 302 which is coupled to a positive voltage source Vdd3. The drain of T3, the source of T6 and a first terminal of R2 are coupled to a terminal 304 which is coupled to a reference voltage that is typically ground (zero volts). An amplifier 300 input terminal 306 is coupled to first terminals of capacitors C1 and C2. A second terminal of capacitor C1 is coupled to the gate of transistor T1, to the source of transistor T5, to the gate and drain of transistor T6 and to a terminal 308. A second terminal of capacitor C2 is coupled to the gate and drain of transistor T2, to the source of transistor T3, to the gate of transistor T4 and to a terminal 310. The drains of transistors T1 and T4 are coupled to the gates of transistors T3 and T5 and to a terminal 314 which serves as an output of amplifier 300. A second terminal of resistor R1 is coupled to the source of transistor T1 and to a terminal 316. A second terminal of resistor R2 is coupled to the source of transistor T4 and to a terminal 318.

Transistors T2 and T3 form a first feedback circuit (shown within a dashed line rectangle) 320 which couples the drain (output terminal 314) of transistor T4 to the gate (terminal 310) thereof. Transistor T2, which has its gate and drain coupled together, acts as a load for transistor T3. Transistors T5 and T6 form a second feedback circuit shown within a dashed line rectangle)

322 which couples the drain (output terminal 314) of transistor T1 to the gate (terminal 308) thereof. Transistor T6, which has its gate and drain coupled together, acts as a load for transistor T5.

The magnitude of the output signal at terminal 314 is set by the voltage Vdd3 and by the ratios of the currents in the feedback circuits 320 and 322 relative to the current in the inverter output transistors T1 and T4. These current ratios are dependent on the device ratios (W/L) of transistor T5 relative to transistor T1 and of transistor T3 relative to transistor T4. Feedback circuit 322 limits the output amplitude for the high end of the input signal; and feedback circuit 320 limits the output amplitude for the low end of the input signal.

Feedback circuits 320 and 322 each comprise transistors of the type opposite conductivity type of their respective output transistors.

Except at the upper and lower limits of the amplitude of an input signal (not shown) applied to input terminal 306, transistors T1 and T4 experience equal and opposite changes in transconductance. For example, as the input signal increases in amplitude, the transconductance of transistor T4 increases and the transconductance of transistor T1 decreases.

An output signal generated by amplifier 300 at terminal 314 is fed directly to the gates of transistor T5 and T3 of feedback circuits 322 and 320, respectively. Feedback circuit 322 controls the voltage at terminal 308 which is connected to the gate of transistor T1. Accordingly, variations in the upper end of the output signal at terminal 314 cause corresponding variations at terminal 308. Variations in voltage at terminal 308 cause compensating variations in the transconductance of transistor T1 and the upper limit of the output signal generated at terminal 314 tends to be stable at a preselected value. The W/L ratio of transistor T3 to T4 determines the amount of feedback provided by feedback circuit 320. The W/L ratio of transistor T5 to T1 determines the amount of feedback provided by feedback circuit 322. Transistors T2 and T6 act essentially as current sources. The W/L ratio of transistor T5 to transistor T6 determines the dc voltage level of terminal 308. The W/L ratio of transistor T3 to transistor T2 determines the dc voltage level of terminal 310.

Feedback circuit 320 controls the voltage at terminal 310 which is connected to the gate of output transistor T4. Accordingly, variations in the lower end of the output signal at terminal 314 cause corresponding variations at terminal 310. Variations in voltage at terminal 310 causes compensating variations in the transconductance of transistor T4 and the lower limit of the output signal tends to be stable at the design value.

The amount of feedback introduced by feedback circuits 320 and 322 determines the output terminal 314 peak-to-peak voltage. The amount of feedback of feedback circuit 322 is determined by the respective sizes of transistors T1, T5 and T6 which determine the most positive level of the voltage generated at output terminal 314. The amount of feedback of feedback circuit 320 is determined by the respective sizes of transistors T2, T3 and T4 which determine the least positive level of the voltage generated at output terminal 314.

Figure 4:
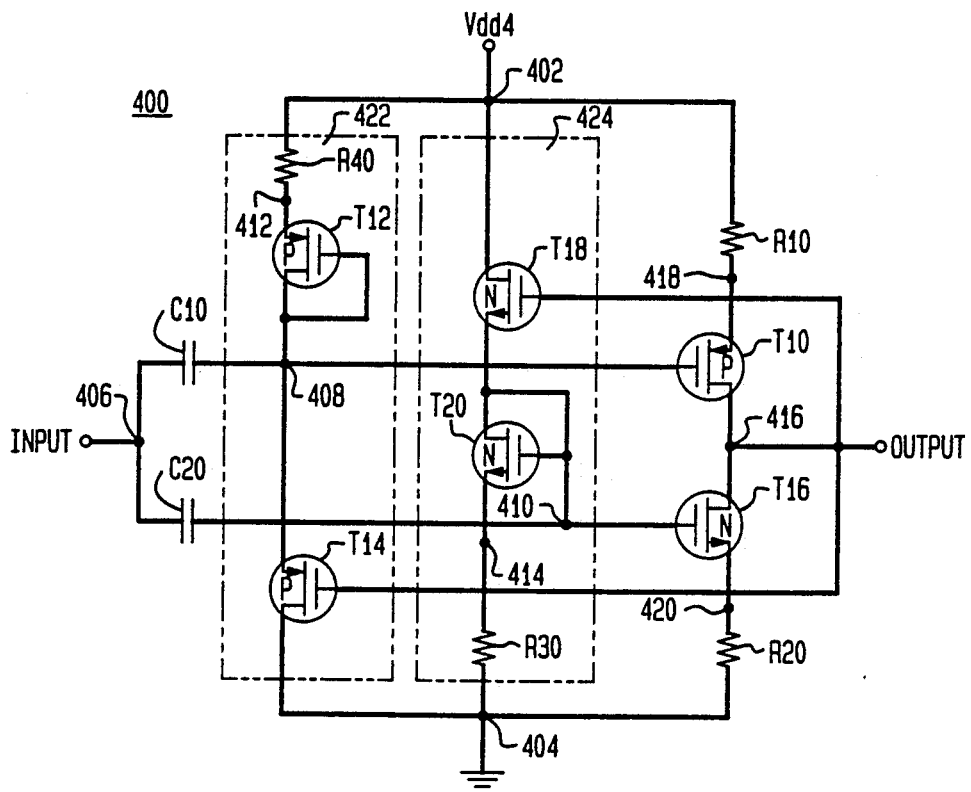
FIG. 4 is an electrical schematic diagram of another amplifier in accordance with the present invention.

Referring now to FIG. 4, there is shown an amplifier 400 in accordance with a preferred embodiment of the invention. The structure of amplifier 400 is useful as amplifier 12 of FIG. 1. Amplifier 400 comprises p-channel FETs T10, T12 and T14, n-channel FETs T16, T18 and T20, resistors R10, R20, R30 and R40 and capacitors C10 and C20. By appropriately sizing transistors T10, T12, T14, T16, T18 and T20 and by appropriate selection of the thermal coefficients of resistors R10, R20, R30 and R40, the amplitude of an output signal of amplifier 400 at an output terminal 416 is essentially independent of IC manufacturing and operating temperature variations within useful limits.

First terminals of resistors R10 and R40 and the source of transistor T18 are coupled to a terminal 402 which is coupled to a positive voltage source Vdd4. First terminals of resistors R20 and R30 and the drain of transistor T14 are coupled to a terminal 404 which is coupled to a reference voltage that is shown as ground (zero volts). First terminals of capacitors C10 and C20 are coupled to a 406 which serves as an input terminal of amplifier 400 terminal A second terminal of capacitor C10 is coupled to the gate of transistor T10, to the gate and drain of transistor T12, to the source of transistor T14 and to a terminal 408. A second terminal of capacitor C20 is coupled to the gate of transistor T16, to the gate and drain of transistor T20, to the source of transistor T18 and to a terminals 410. A second terminal of resistor R40 is coupled to the source of transistor T12 and to a terminal 412. The source of transistor T20 is coupled to a second terminal of resistor R30 and to a terminal 414. The drains of transistors T10 and T16 are coupled to the gates of transistors T14 and T18 and to the terminal 416 which serves as an output terminal of amplifier 400. A second terminal of resistor R10 is coupled to the source of transistor T10 and to a terminal 418. A second terminal of resistor R20 is coupled to the source of transistor T16 and to a terminal 420.

Transistors T10, T12, T14, T16, T18 and T20 are typically metal-oxide-semiconductor (MOS) FETS (or MOSFETS) and resistors R10, R20, R30 and R40 are typically polysilicon resistors and have a negative thermal coefficient. All of the transistors and resistors are typically formed in a common semiconductor body (substrate), typically silicon. The semiconductor body may be denoted as an integrated circuit (IC) or as a chip. Transistors T12 and T14 and resistor R40 form a first feedback circuit 422 (shown within a dashed line rectangle) which couples the drain of transistor T10 (the output terminal 416) to the gate. (terminal 408) thereof. Transistors T18 and T20 and resistor R30 form a second feedback circuit 424 (shown within a dashed line rectangle) which couples the drain of transistor T16 (the output terminal 416) to the gate (terminal 410) thereof.

Amplifier 400 is similar to amplifier 300 of FIG. 3 and functions in a similar manner. Feedback circuits 422 and 424 each include a separate resistor which is not included in feedback circuits 320 and 322 of amplifier 300. The transistors of feedback circuits 422 and 424 are of the same conductivity type as the transistor they provide feedback for whereas the transistors of feedback circuits 320 and 322 are of the opposite conductivity of the transistors they provide feedback for. Since an output transistor and the transistors of its associated feedback circuit of amplifier 400 have the same conductivity type, variations in threshold voltages and other transistor characteristics caused by a integrated circuit manufacturing process and operating temperature variations track closely and are therefore cancelled out. In addition the use of negative thermal coefficient resistors R30 and R40, which have the same characteristics as resistors R10 and R20, adds additional stability to the amplitude of a generated output signal of amplifier 400. Accordingly, amplifier 400 has a stabilized gain which results in an essentially fixed amplitude even with variations in the IC manufacturing process and temperature variations with useful ranges.

In one illustrative embodiment of amplifier 400, Vdd4=5.0 volts, resistors R10, R20, R30 and R40 are polysilicon resistors having a negative thermal coefficient with each having a resistance of 500 ohms, capacitors C10 and C20 each have a capacitance of 3 pF, and transistors T10, T12, T14, T16, T18 and T20 are MOSFETS having width to length ratios of 105/4, 10/31, 372/4, 35/4, 160/4 and 10/26, respectively.

It is to be understood that the specific embodiments described herein are merely illustrative of the spirit of the invention. Various modifications consistent with the spirit of the invention are possible. For example, complementary bipolar transistors could be substituted for the MOSFETS provided appropriate modifications are made to take into account the somewhat different characteristics of bipolar transistors compared to MOSFETS. Still further, the resistors can be replaced by other types of load elements that have similar characteristics.

We claim:

1. An amplifier comprising:
   first and second complementary output transistors; and
   first and second independent negative feedback circuit means coupled to the first and second transistors, respectively, for independently controlling the operating voltages of said output transistors
   said feedback circuit means each comprising transistor circuit which are physically proportioned relative to their respective output transistors to achieve substantially equal sensitivity control at upper and lower limits of amplitude of an amplifier output signal
   each of said output transistors having a first output terminal respectively connected to first and second potential sources via compensating resistors having a negative temperature coefficient.

2. An oscillator comprising:
   an input terminal and an output terminal;
   a tuned circuit comprising an input and or output; an amplifier having an input and an output and first and second bias potential terminals;
   first means for coupling said amplifier output terminal to said tuned circuit input terminal;
   second means for coupling said tuned circuit output to said amplifier input;
   said amplifier comprises:
      first and second complementary field effect transistors each having a gate, a drain and a source;
      means for connecting the drains of said transistors to one and another and to said amplifier output;
      first and second resistors having a negative temperature coefficient and respectively connected between the source terminals of said first and second transistors and said first and second bias voltage terminals;
      first and second input capacitors respectively connected between said amplifier input and the gates of said first and second transistors; and
      separate first and second feedback means connected between said amplifier output and said gates of said first and second transistors for independently setting the gate voltages of said first and second transistors.

3. An inverting amplifier comprising:
   and input terminal, an output terminal and first and second bias potential terminals;
   first and second complementary field effect transistors each having a gate, a drain and a source;
   means for connecting drain terminals of said transistors to one and another and to said amplifier output terminal;
   first and second resistors respectively connected between source terminals of said first and second transistors and said first and second bias potential terminals;
   first and second capacitors respectively connected between said amplifier input terminal and the gate terminals of said first and second transistors; and
   separate first and second feedback means respectively conducted between said amplifier output terminal and said gate terminals of said first and second transistors for independently setting the gate voltages of said first and second transistors.

4. Circuitry comprising:
   first and second complementary field effect transistors each having a gate and first and second outputs;
   first and second ac coupling means each having first and second terminals for coupling ac signals therethrough;
   a first feedback circuit comprising field effect transistors and having an input coupled to the first output of the first transistor and having an output coupled to the gate of the first transistor;
   a second feedback circuit comprising field effect transistors and having an input coupled to the first output of the second transistor and having an output coupled to the gate of the second transistor;
   the second terminal of the first ac coupling means being coupled to the gate of the first transistor;
   a second terminal of the second ac coupling means being coupled to the gate of the second transistor; and
   a circuitry input terminal being coupled to the first terminals of the first and second ac coupling means and a circuitry output terminal being coupled to the first outputs of the first and second transistors.

5. The circuitry of claim 4 further comprising:
   first and second resistors;
   a first terminal of the first resistor being coupled to the second output of the first transistor; and
   a first terminal of the second resistor being coupled to the second output of the second transistor.

6. The circuitry of claim 9 wherein:
   the first feedback circuit comprises third and fourth field effect transistors with each having a gate and first and second outputs;
   the second feedback circuit comprises fifth and sixth field effect transistors with each having a gate and first and second output;
   the gate and first output of the third transistor being coupled to the first output and gate, respectively, of the first transistor;
   the gate and first output of the fifth transistor being coupled to the first output and gate, respectively, of the second transistor; and
   the first and second ac coupling means each being a capacitor.

7. The circuitry of claim 6 wherein:
   the first feedback circuit comprises a third resistor;

the second feedback circuit comprises a fourth resistor;
the third resistor being coupled by a first terminal to the second output of the fourth transistor;
the fourth resistor being coupled by a first terminal to the second output of the sixth transistor; and
the third and fourth transistors are of the same conductivity type as the first transistor and the fifth and sixth transistors are of the same conductivity type as the second transistor.

8. The circuitry of claim 7 wherein:
second terminals of the first and fourth resistors and a second output of the third transistor are coupled together to a first supply voltage terminal; and
second terminals of the second and third resistors and the second output of the fifth transistor are coupled together to a second supply voltage terminal.

9. The circuitry of claim 8 wherein the transistors, capacitors and resistors are formed on a common semiconductor body and the resistors have a negative thermal coefficient.

10. The circuitry of claim 9 wherein the resistors are formed of polysilicon, the semiconductor body is silicon and the transistors are metal-oxide-silicon type field effect transitors.

11. The circuitry of claim 6 wherein:
a second terminal of the first resistor is coupled to the second outputs of the third and sixth transistors and to a first voltage supply terminal; and
a second terminal of the second resistor is coupled to second output terminals of the fourth and fifth transistors and to a second voltage supply terminal.

12. The circuitry of claim 10 wherein the transistors, capacitors and resistors are formed on a common semiconductor body and the resistors have a negative thermal coefficient.

13. The circuitry of claim 12 wherein the resistors are formed of polysilicon, the semiconductor body is silicon and the transistors are metal-oxide-silicon type field effect transistors.

14. An inverting amplifier comprising:
a first p-channel metal-oxide-semiconductor field effect transistor having a gate, a drain and a source;
a second n-channel metal-oxide-semiconductor field effect transistor having a gate, a drain and a source;
first and second resistors each having first and second terminals;
first and second capacitors each having first and second terminals;
a first feedback circuit comprising a third resistor and third and fourth n-channel metal-oxide-semiconductor field effect transistors each having a gate, a drain and a source;
a second feedback circuit comprising a fourth resistor and fifth and sixth p-channel metal-oxide-semiconductor field effect transistors each having a gate, a drain and a source;
the inverting amplifier having an input terminal coupled to the first terminals of the capacitors and having an output terminal coupled to the drains of the first and second transistors;
the source of the third transistor being coupled to the drain and gate of the fourth transistor, to the gate of the second transistor and to the second terminal of the second capacitor;
the source of the fourth transistor being coupled to the first terminal of the third resistor;
the source of the fifth transistor being coupled to the drain and gate of the sixth transistor, to the gate of the first transistor and to the second terminal of the first capacitor;
the source of the sixth transistor being coupled to the first terminal of the fourth resistor;
the source of the first transistor being coupled to the first terminal of the first resistor; and
the source of the second transistor being coupled to the first terminal of the second resistor.

15. The inverting amplifier of claim 14 wherein the transistors, resistors and capacitors are formed on a common silicon body and the resistors have negative temperature coefficients.

16. The inverting amplifier of claim 15 wherein:
the resistors are polysilicon resistors;
the second terminals of the first and fourth resistors and the drain of the third transistor are coupled together to a first voltage supply terminal; and
the second terminals of the second and third resistors and the drain of the fifth transistor are coupled together to a second voltage supply terminal.

17. An inverting amplifier comprising:
a first p-channel metal-oxide-semiconductor field effect transistor having a gate, a drain and a source;
a second n-channel metal-oxide-semiconductor field effect transistor having a gate, a drain and a source;
first and second resistors each having first and second terminals;
first and second capacitors each having first and second terminals;
a first feedback circuit comprising third and fourth p-channel metal-oxide-semiconductor field effect transistors each having a gate, a drain and a source;
a second feedback circuit comprising fifth and sixth n-channel metal-oxide-semiconductor field effect transistors each having a gate, a drain and a source;
the inverting amplifier having an input terminal coupled to the first terminals of the capacitors and having an output terminal coupled to the drains of the first and second transistors;
the drain of the third transistor being coupled to the drain and gate of the fourth transistor, to the gate of the first transistor and to the second terminal of the first capacitor;
the source of the fifth transistor being coupled to the drain and gate of the sixth transistor, to the gate of the second transistor and to the second . terminal of the second capacitor;
the source of the first transistor being coupled to the first terminal of the first resistor; and
the source of the second transistor being coupled to the first terminal of the second transistor.

18. The inverting amplifier of claim 17 wherein the transistors, resistors and capacitors are formed on a common silicon body and the resistors have negative temperature coefficients.

19. The inverting amplifier of claim 18 wherein:
the resistors are polysilicon resistors;
the second terminal of the first resistor, the drain of the, third transistor and the source of the sixth transistor are coupled together to a first voltage supply terminal; and
the second terminal of the second resistor, the source of the fourth transistor and the drain of the fifth transistor are coupled together to a second voltage supply terminal.

* * * * *